US012218233B2

United States Patent
(12) United States Patent
Oh et al.

(10) Patent No.: US 12,218,233 B2
(45) Date of Patent: Feb. 4, 2025

(54) HIGH ELECTRON MOBILITY TRANSISTOR AND METHOD OF MANUFACTURING THE SAME

(71) Applicant: Samsung Electronics Co., Ltd., Suwon-si (KR)

(72) Inventors: Jaejoon Oh, Seongnam-si (KR); Jongseob Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 34 days.

(21) Appl. No.: 17/902,383

(22) Filed: Sep. 2, 2022

(65) Prior Publication Data

US 2022/0416071 A1 Dec. 29, 2022

Related U.S. Application Data

(62) Division of application No. 16/939,274, filed on Jul. 27, 2020, now abandoned.

(30) Foreign Application Priority Data

Mar. 24, 2020 (KR) ........................ 10-2020-0035803

(51) Int. Cl.
*H01L 29/778* (2006.01)
*H01L 21/285* (2006.01)
(Continued)

(52) U.S. Cl.
CPC .... *H01L 29/7786* (2013.01); *H01L 21/28587* (2013.01); *H01L 29/2003* (2013.01);
(Continued)

(58) Field of Classification Search
CPC ........................ H01L 29/7787; H01L 29/7786
See application file for complete search history.

(56) References Cited

U.S. PATENT DOCUMENTS 8,633,494 B2 1/2014 Nishimori et al.
8,716,754 B2 5/2014 Park et al.
(Continued)

FOREIGN PATENT DOCUMENTS

EP 2923382 A1 9/2015
JP 6090361 B2 3/2017
(Continued)

OTHER PUBLICATIONS

Korean Office Action dated Sep. 20, 2024 for corresponding Korean Patent Application No. 2020/0035803 and its English-language translation.

*Primary Examiner* — Grant S Withers
(74) *Attorney, Agent, or Firm* — HARNESS, DICKEY & PIERCE, P.L.C.

(57) ABSTRACT

A high electron mobility transistor and a method of manufacturing the same are disclosed. The high electron mobility transistor includes a channel layer, a channel supplying layer causing generation of a two-dimensional electron gas (2DEG) in the channel layer, a source electrode and a drain electrode provided on respective sides of the channel supplying layer, a depletion forming layer provided on the channel supplying layer to form a depletion region in the 2DEG, a gate electrode provided on a portion of the depletion forming layer, and a current limiting layer provided to contact the gate electrode on another portion of the depletion forming layer. The current limiting layer limits a current flow from the gate electrode to the depletion forming layer according to a voltage applied to the gate electrode.

20 Claims, 26 Drawing Sheets

(51) Int. Cl.
*H01L 29/20* (2006.01)
*H01L 29/205* (2006.01)
*H01L 29/423* (2006.01)
*H01L 29/66* (2006.01)

(52) U.S. Cl.
CPC ...... *H01L 29/205* (2013.01); *H01L 29/42316* (2013.01); *H01L 29/66462* (2013.01)

(56) References Cited

U.S. PATENT DOCUMENTS

| | | | |
|---|---|---|---|
| 8,860,087 | B2 | 10/2014 | Park et al. |
| 9,379,227 | B2 | 6/2016 | Lee et al. |
| 10,204,778 | B2 | 2/2019 | Odnoblyudov et al. |
| 2013/0083567 | A1 | 4/2013 | Imada |
| 2014/0097470 | A1 | 4/2014 | Kim et al. |
| 2018/0323297 | A1 | 11/2018 | Suh et al. |
| 2020/0176595 | A1 | 6/2020 | Otake et al. |
| 2022/0052191 | A1 | 2/2022 | Cheng |

FOREIGN PATENT DOCUMENTS

| | | | |
|---|---|---|---|
| KR | 2013/0035174 | A | 4/2013 |
| KR | 2013/0035476 | A | 4/2013 |
| KR | 101882997 | B1 | 7/2018 |
| KR | 102036349 | B1 | 10/2019 |

HIGH ELECTRON MOBILITY TRANSISTOR AND METHOD OF MANUFACTURING THE SAME

CROSS-REFERENCE TO RELATED APPLICATION

This application is a divisional of U.S. application Ser. No. 16/939,274, filed Jul. 27, 2020, and claims the benefit of Korean Patent Application No. 10-2020-0035803, filed on Mar. 24, 2020, in the Korean Intellectual Property Office, the disclosure of each of which is incorporated herein in its entirety by reference.

BACKGROUND

1. Field

The present disclosure relates to a high electron mobility transistor and a method of manufacturing the same.

2. Description of Related Art

Various power conversion systems require devices that control the flow of current through ON/OFF switching, that is, power devices. The efficiency of a power device in a power conversion system can influence the efficiency of the entire system.

Power devices based on silicon (Si) have limitations in increasing the efficiency due to limitations of the physical properties of silicon and the manufacturing processes. In order to overcome these limitations, research and development have been conducted to increase the conversion efficiency by applying a III-V-based compound semiconductor such as GaN to a power device. Recently, a high electron mobility transistor (HEMT) having a compound semiconductor with a heterojunction structure has been studied.

SUMMARY

The present disclosure provides a high electron mobility transistor and a method of manufacturing the same.

Additional aspects will be set forth in part in the description which follows and, in part, will be apparent from the description, or may be learned by practice of the presented embodiments of the disclosure.

In one embodiment, a high electron mobility transistor includes: a channel layer including a first semiconductor material; a channel supplying layer including a second semiconductor material and causing generation of a two-dimensional electron gas (2DEG) in the channel layer; a source electrode and a drain electrode provided on both sides of the channel supplying layer; a depletion forming layer provided on the channel supplying layer to form a depletion region in the 2DEG; a gate electrode provided on a portion of the depletion forming layer; and a current limiting layer provided to contact the gate electrode on another portion of the depletion forming layer, and configured to limit a current flow from the gate electrode to the depletion forming layer according to a voltage applied to the gate electrode.

In some embodiments, the depletion forming layer may include a p-type III-V group nitride semiconductor, and the current limiting layer may include an n-type III-V group nitride semiconductor.

In some embodiments, the gate electrode may include an upper portion in contact with an upper surface of the current limiting layer and a lower portion in contact with a side surface of the current limiting layer.

In some embodiments, the depletion forming layer may be an integral type and may extend in a direction parallel to the gate electrode.

In some embodiments, the current limiting layer may be respectively provided on both sides of a lower side of the gate electrode. The current limiting layer may be of an integral type and may extend in a direction parallel to the gate electrode. The current limiting layer may include portions spaced apart from each other in a direction parallel to the gate electrode.

In some embodiments, the current limiting layer may surround a lower portion of the gate electrode.

In some embodiments, the depletion forming layer may have portions spaced apart from each other in a direction parallel to the gate electrode.

In some embodiments, the current limiting layers may be respectively provided on both sides of a lower side of the gate electrode. The current limiting layer may be of an integral type and extend in a direction parallel to the gate electrode. The current limiting layer may include portions spaced apart from each other in a direction parallel to the gate electrode.

In some embodiments, the current limiting layer may surround a lower portion of the gate electrode.

In some embodiments, the high electron mobility transistor may further include an etch stop layer between the gate electrode and the current limiting layer and the depletion forming layer.

In some embodiments, the first semiconductor material may include a GaN-based material. The second semiconductor material may include a nitride including at least one of Al, Ga, In, and B.

In another embodiment, a method of manufacturing a high electron mobility transistor includes: forming a channel layer and a channel supplying layer; forming a depletion forming layer on the channel supplying layer; forming a current limiting layer on the depletion forming layer; patterning the current limiting layer to form a trench that exposes the depletion forming layer; and forming a gate electrode in the current limiting layer to fill the trench.

In some embodiments, the method may further include, after forming the depletion forming layer, forming an etch stop layer on the depletion forming layer.

In some embodiments, the current limiting layer may be respectively formed on both sides of a lower side of the gate electrode.

In some embodiments, the current limiting layer may surround a lower portion of the gate electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
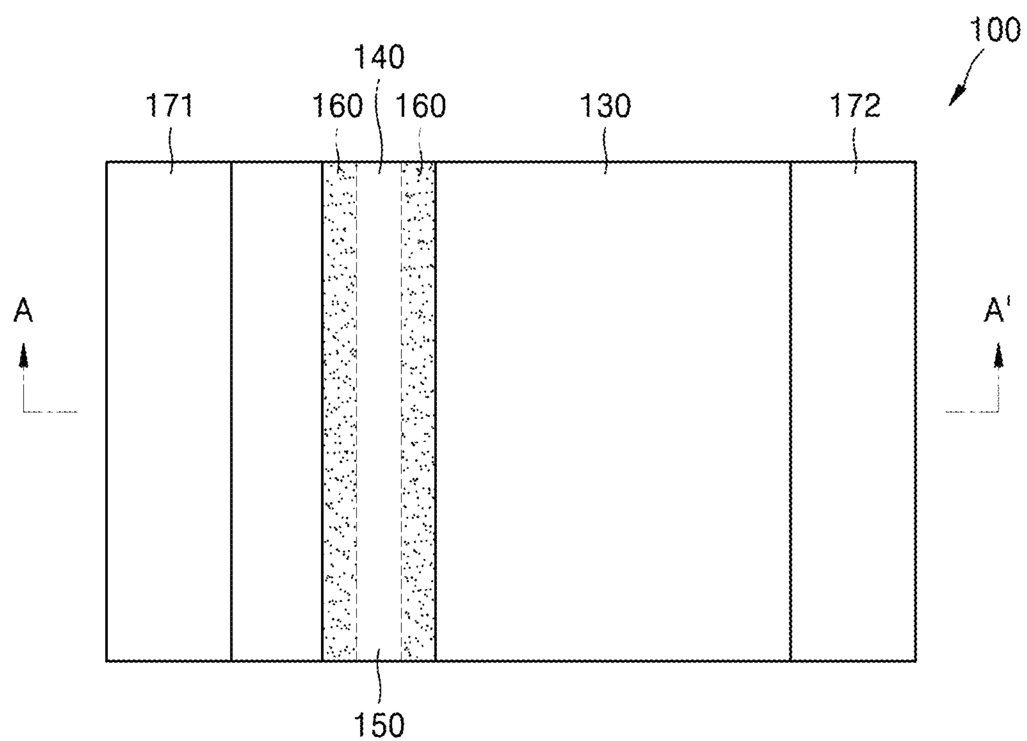
FIG. 1 is a plan view showing a high electron mobility transistor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term “and/or” includes any and all combinations of one or more of the associated listed items. Expressions such as “at least one of,” when preceding a list of elements, modify the entire list of elements and do not modify the individual elements of the list.

Hereinafter, example embodiments will be described in detail with reference to the accompanying drawings. In the drawings below, like reference numerals refer to like elements, and the size of each component in the drawings may be exaggerated for clarity and convenience of description. Meanwhile, embodiments described below are merely examples, and various modifications are possible from these embodiments.

Hereinafter, what is described as “upper” or “on” may include not only directly over in contact but also over not in contact. The terms of a singular form may include plural forms unless otherwise specified. Also, when a part “includes” a component, this means that, unless specifically stated otherwise, it may further include other components rather than excluding other components.

The use of the term “above” and similar indication terms may correspond to both singular and plural. Unless explicitly stated or contrary to the steps constituting the method, these steps may be performed in a suitable order and are not necessarily limited to the described order.

The terms “part”, “module”, and the like, which are described in the specification, mean a unit for processing at least one function or operation, and the unit may be implemented in hardware or software, or in a combination of hardware and software.

The connection or connection members of the lines between the components shown in the drawings are illustrative examples of functional connections and/or physical or circuit connections, and may be represented as an alternative or additional various functional connections, physical connections, or circuit connections in actual devices.

The use of all examples or example terminology is merely for describing the technical idea in detail and the scope is not limited by these examples or example terms unless it is limited by the claims.

The high electron mobility transistor (HEMT) includes semiconductor layers having different electrical polarization characteristics. In the HEMT, a semiconductor layer having a relatively large polarizability can induce generation of a 2-Dimensional Electron Gas (2DEG) in another semiconductor layer bonded thereto, and the 2DEG may have very high electron mobility.

Moreover, when a gate voltage is 0 V in the HEMT, if the HEMT is in a normally-on state in which current flows due to a low resistance between the drain electrode and the source electrode, current and power consumption may occur, and in order to turn off the current between the drain electrode and the source electrode, there is a problem that a negative voltage must be applied to the gate electrode. As a solution to these problems, as a depletion forming layer is provided, when the gate voltage is 0V, a normally-off characteristic in which the current between the drain electrode and the source electrode is in an off state may be implemented.

Figure 2:
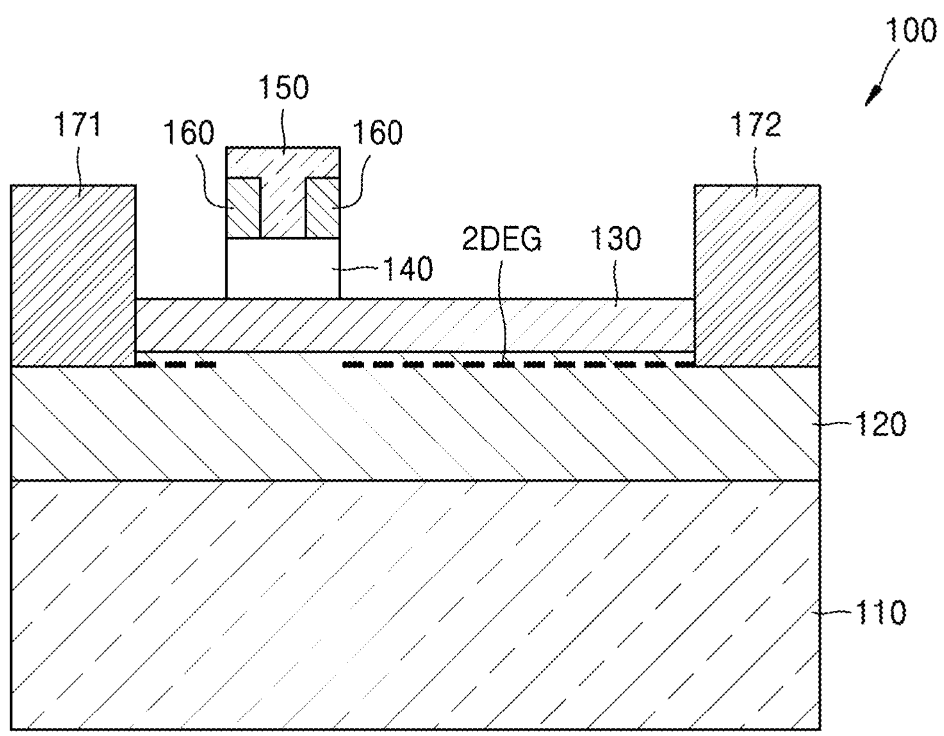
FIG. 2 is a cross-sectional view taken along line A-A' of FIG. 1.

FIG. 1 is a plan view showing an HEMT 100 according to an example embodiment. FIG. 2 is a cross-sectional view taken along a line A-A' of FIG. 1.

Referring to FIGS. 1 and 2, a channel layer 120 is provided on a substrate 110. The substrate 110 may include, for example, sapphire, Si, SiC, or GaN. However, this is merely an example, and the substrate 110 may include various other materials.

The channel layer 120 may include a first semiconductor material. Here, the first semiconductor material may be a III-V-based compound semiconductor material, but is not limited thereto. For example, the channel layer 120 may be a GaN-based material layer, specifically, a GaN layer. In this case, the channel layer 120 may be an undoped GaN layer, and in some cases, may be a desired (and/or alternatively predetermined) impurity-doped GaN layer.

Although not illustrated in the drawing, a buffer layer may be further provided between the substrate 110 and the channel layer 120. The buffer layer is for alleviating the difference of the lattice constant and the coefficient of thermal expansion between the substrate 110 and the channel layer 120. The buffer layer may include nitride including at least one of Al, Ga, In, and B, and may have a single layer or multi-layer structure. For example, the buffer layer may include at least one of AlN, GaN, AlGaN, InGaN, AlInN, and AlGaInN. A seed layer (not shown) for growing the buffer layer may be further provided between the substrate 110 and the buffer layer.

A channel supplying layer 130 may be provided on the channel layer 120. The channel supplying layer 130 may induce generation of a two-dimensional electron gas 2DEG in the channel layer 120. The 2DEG may be formed in the channel layer 120 below the interface between the channel layer 120 and the channel supplying layer 130. The channel supplying layer 130 may include a second semiconductor material different from the first semiconductor material forming the channel layer 120. The second semiconductor material may have at least one of a polarization characteristic, an energy bandgap, and a lattice constant, which is different from that of the first semiconductor material.

The second semiconductor material may have at least one of a polarization rate and an energy band gap, which is greater than that of the first semiconductor material. The channel supplying layer 130 may include, for example, nitride including at least one of Al, Ga, In, and B, and may have a single layer or multi-layer structure. As a specific example, the channel supplying layer 130 may include at least one of AlGaN, AlInN, InGaN, AlN, and AlInGaN. However, inventive concepts are not limited thereto. The channel supplying layer 130 may be an undoped layer, but may also be a layer doped with a desired (and/or alternatively predetermined) impurity.

The source electrode 171 and the drain electrode 172 may be provided in parallel to each other on the channel layer 120 on respective sides of the channel supplying layer 130. Here, the source electrode 171 and the drain electrode 172 may be electrically connected to the 2DEG. Meanwhile, the source electrode 171 and the drain electrode 172 may be provided on the channel supplying layer 130.

A depletion forming layer 140 may be provided on the channel supplying layer 130 between the source electrode 171 and the drain electrode 172. Here, the depletion forming layer 140 may be provided as an integral type extending in a direction parallel to the source electrode 171 and the drain electrode 172.

The depletion forming layer 140 may include a p-type semiconductor material. That is, the depletion forming layer 140 may be a semiconductor layer doped with p-type impurities. The depletion forming layer 140 may include a III-V-based nitride semiconductor. The depletion forming layer 140 may include, for example, a material doped with p-type impurities in at least one of GaN, AlGaN, InN, AlInN, InGaN, and AlInGaN. As a specific example, the depletion forming layer 140 may be a p-GaN layer.

Since the depletion forming layer 140 may increase the energy bandgap of the channel supplying layer 130 located therebelow, a depletion region of a 2DEG may be formed in a portion of the channel layer 120 corresponding to the depletion forming layer 140. Accordingly, a portion corresponding to the depletion forming layer 140 of the 2DEG may be cut off or have different characteristics (e.g., electron concentration, etc.) from the remaining portions. The region where the 2DEG is cut off can be referred to as a 'break region', and when the gate voltage is 0V, the HEMT 100 may have a normally-off characteristic in which the current between the drain electrode and the source electrode is in an off state by the disconnection region.

A gate electrode 150 and a pair of current limiting layers 160 split by the gate electrode 150 may be provided on the depletion forming layer 140. The gate electrode 150 may be provided as an integral type extending in a direction parallel to the depletion forming layer 140. In addition, each current limiting layer 160 may be provided as an integral type extending in a direction parallel to the gate electrode 150.

The gate electrode 150 may include an upper portion contacting an upper surface of the current limiting layer 160 and a lower portion contacting a side surface of the current limiting layer 160. Accordingly, the gate electrode 150 may be provided to contact both the depletion forming layer 140 and the current limiting layers 160. The gate electrode 150 may include various metal materials or metal compounds.

The pair of current limiting layers 160 provided on both lower sides of the gate electrode 150 serves to limit the current flow from the gate electrode 150 to the depletion forming layer 140 depending on the voltage applied to the gate electrode 150. The current limiting layer 160 may include an n-type semiconductor material. That is, the current limiting layer 160 may be a semiconductor layer doped with n-type impurities. The current limiting layer 160 may include a III-V-based nitride semiconductor. The current limiting layer 160 may include, for example, a material doped with n-type impurities in at least one of GaN, AlGaN, InN, AlInN, InGaN, and AlInGaN. As a specific example, the current limiting layer 160 may be an n-GaN layer.

When a high voltage (e.g., it may be approximately 3V or more, but is not limited thereto) is applied to the gate electrode 150 during the turn-on operation of the HEMT 100, the current limiting layer 160 may serve to prevent the leakage current through the gate electrode 150 from increasing.

Specifically, each current limiting layer 160 forms a p-n junction with the depletion forming layer 140 below the gate electrode 150. In this case, when a desired (and/or alternatively predetermined) high voltage is applied to the gate electrode 150, the flow of leakage current flowing from the gate electrode 150 to the depletion forming layer 140 may be limited by expanding the depletion region by p-n junction.

The interval between the pair of current limiting layers 160 separated by the gate electrode 150 may be determined by the maximum value of the gate current. In addition, the area and height of each current limiting layer 160 may be adjusted by the concentration of n-type impurities in the current limiting layer 160 or may be adjusted according to the concentration of p-type impurities in the depletion forming layer 140.

Figure 3A:
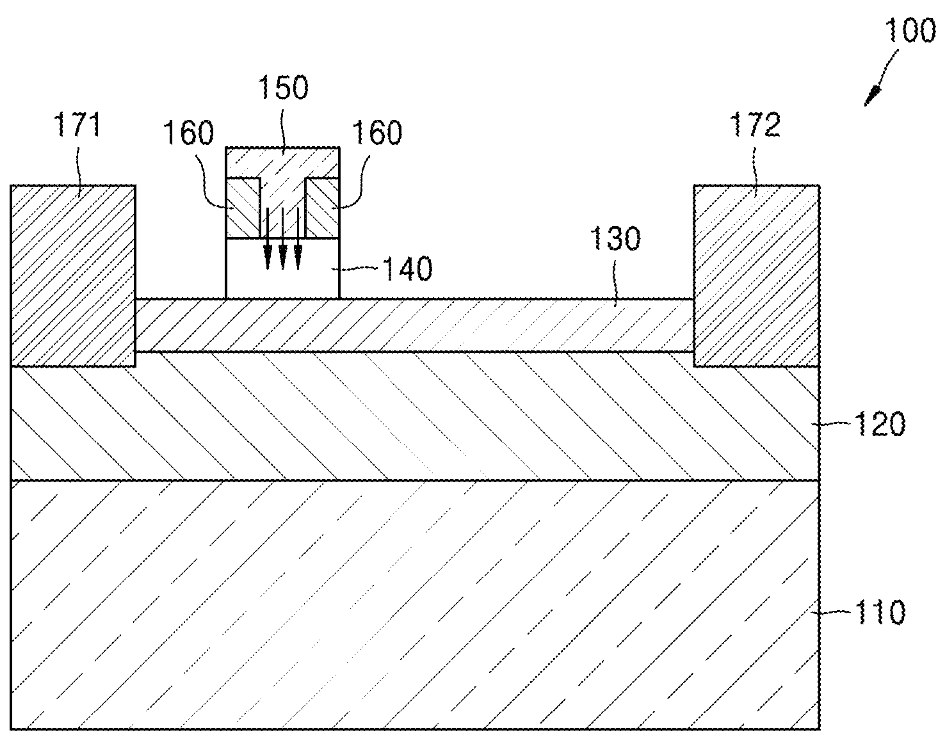
FIGS. 3A and 3B show the flow of a gate leakage current according to a turn on voltage applied to a gate electrode in the high electron mobility transistor shown in FIG. 1.
Figure 3B:
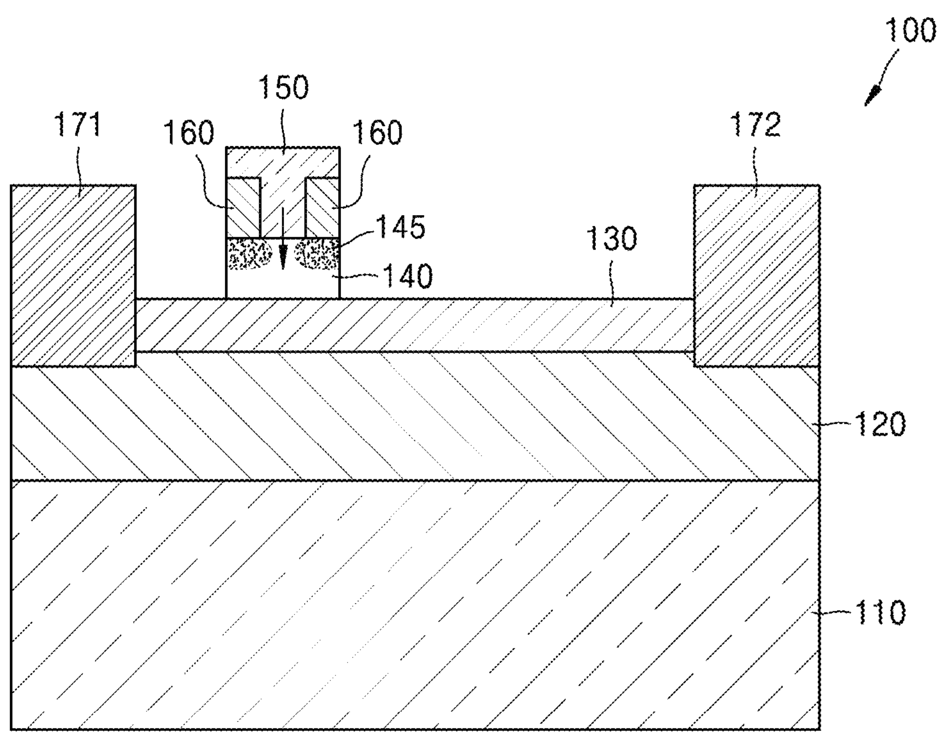

FIGS. 3A and 3B show the flow of the gate leakage current according to the turn on voltage applied to the gate electrode 150 in the HEMT 100 shown in FIG. 1.

FIG. 3A illustrates the flow of the gate leakage current when the voltage applied to the gate electrode 150 is low. FIG. 3B illustrates the flow of the gate leakage current when the voltage applied to the gate electrode 150 is high.

As shown in FIG. 3A, when the voltage applied to the gate electrode 150 is low, the depletion region due to the p-n junction formed between the depletion forming layer 140 and the current limiting layer 160 is limited so that the flow of leakage current through the gate electrode 150 may not be limited. On the other hand, as shown in FIG. 3B, when the voltage applied to the gate electrode 150 is high, by expanding the depletion region by the p-n junction formed between the depletion forming layer 140 and the current limiting layer 160, the flow of leakage current through the gate electrode 150 may be limited.

Figure 4A:
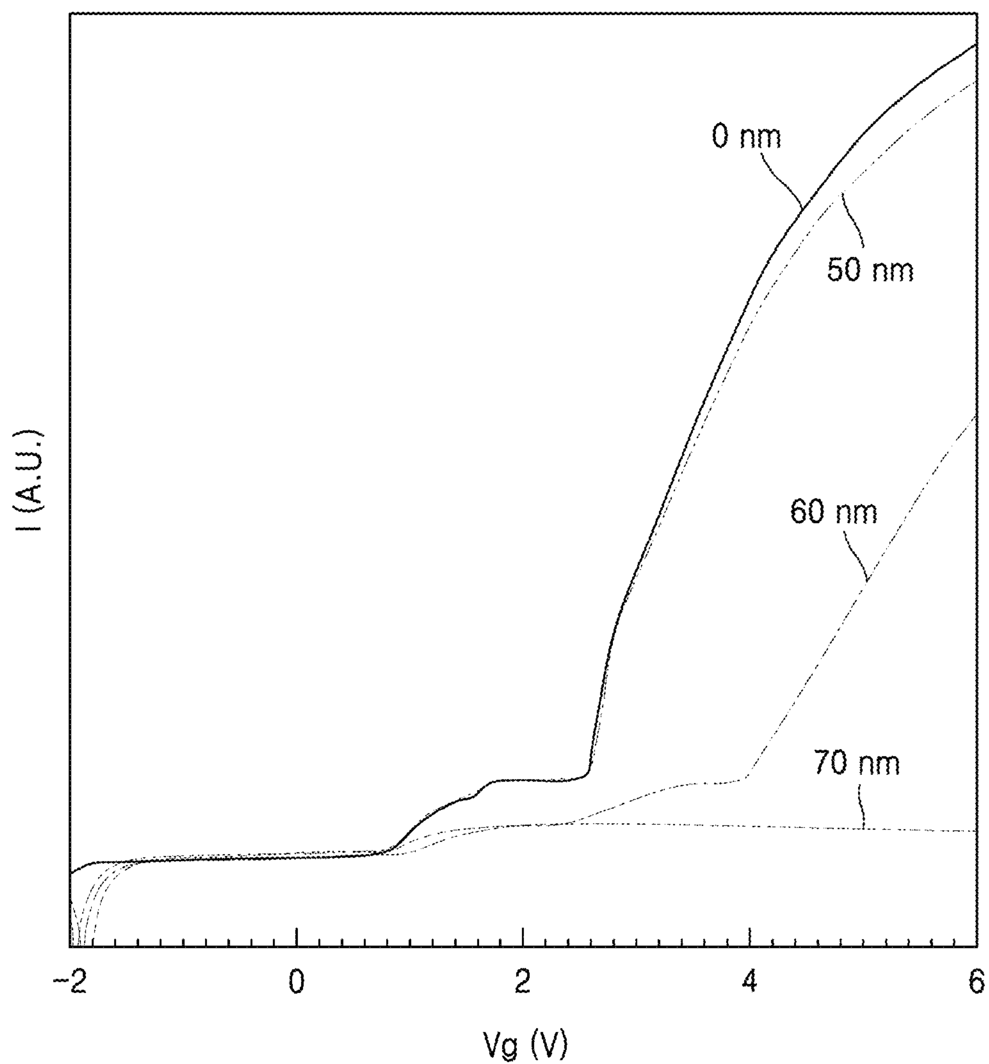
FIG. 4A shows simulation results with regard to a gate leakage current according to the height of a current limiting layer in the high electron mobility transistor shown in FIG. 1.

FIG. 4A is a simulation result showing a gate leakage current according to the height of each current limiting layer 160 in the HEMT 100 shown in FIG. 1. FIG. 4A shows the results of increasing the heights of the current limiting layer 160 to 0 nm, 50 nm, 60 nm, and 70 nm, respectively. Here, the concentration of the n-type impurity in the current limiting layer 160 was 5E18.

Referring to FIG. 4A, it can be seen that the gate leakage current I decreased as the height of the current limiting layer 160 increased when the gate voltage Vg was higher than approximately 3V.

Figure 4B:
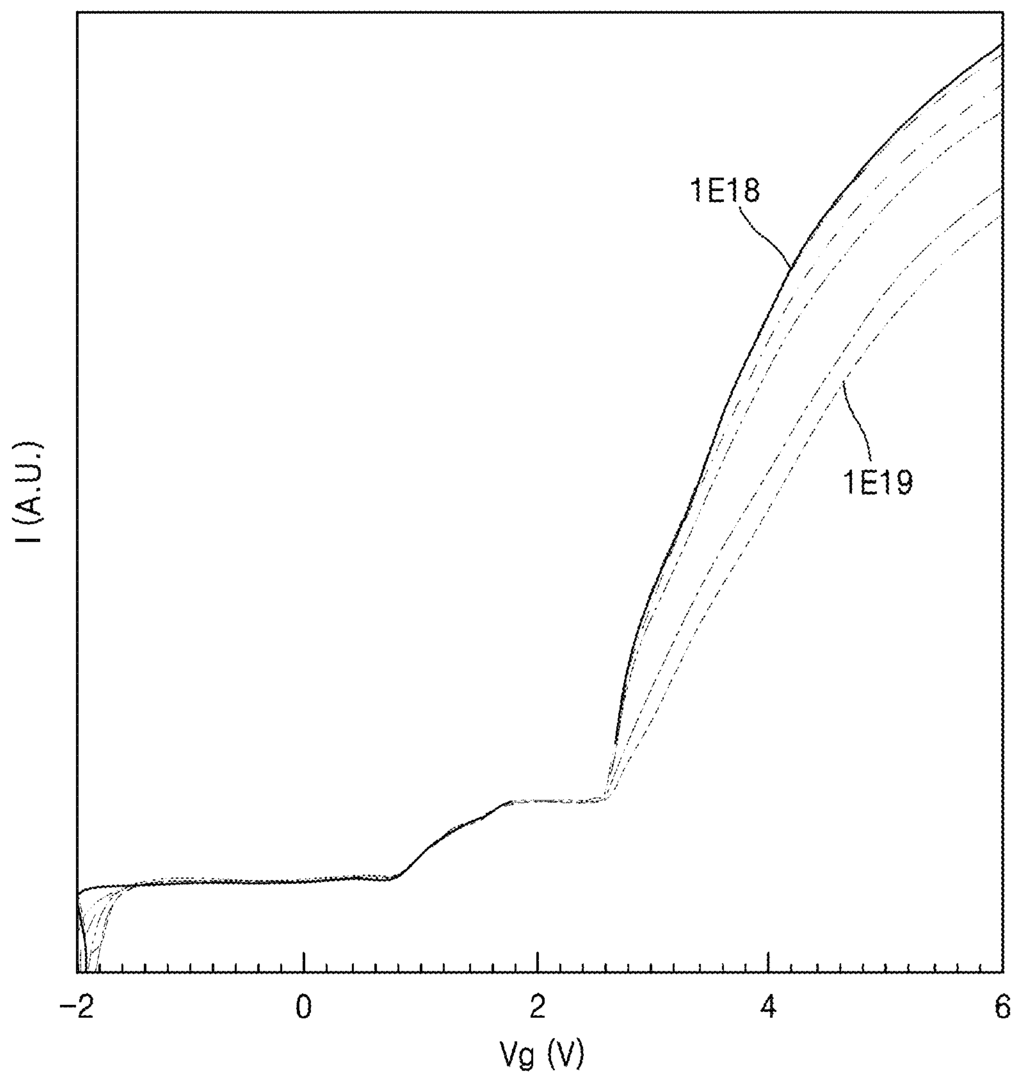
FIG. 4B shows simulation results with regard to a gate leakage current according to the doping concentration of a current limiting layer in the high electron mobility transistor illustrated in FIG. 1.

FIG. 4B is a simulation result showing the gate leakage current according to the doping concentration in the current limiting layer 160 in the HEMT 100 illustrated in FIG. 1. FIG. 4B shows the results of increasing the concentration of n-type impurities in the current limiting layer 160 from 1E18 to 1E19. Here, the height of the current limiting layer 160 was 50 nm.

Referring to FIG. 4B, it can be seen that the gate leakage current I decreased as the concentration of the n-type impurity of the current limiting layer 160 increased when the gate voltage Vg was higher than approximately 3V.

In the HEMT 100 according to the above embodiment, as the p-type semiconductor layer depletion forming layer 140 and the n-type semiconductor layer current limiting layer 160 are provided in contact with the gate electrode 150, when a high voltage is applied to the gate electrode 150, it is possible to prevent the leakage current through the gate electrode 150 from increasing by expanding the depletion region 145 by the p-n junction.

Figure 5:
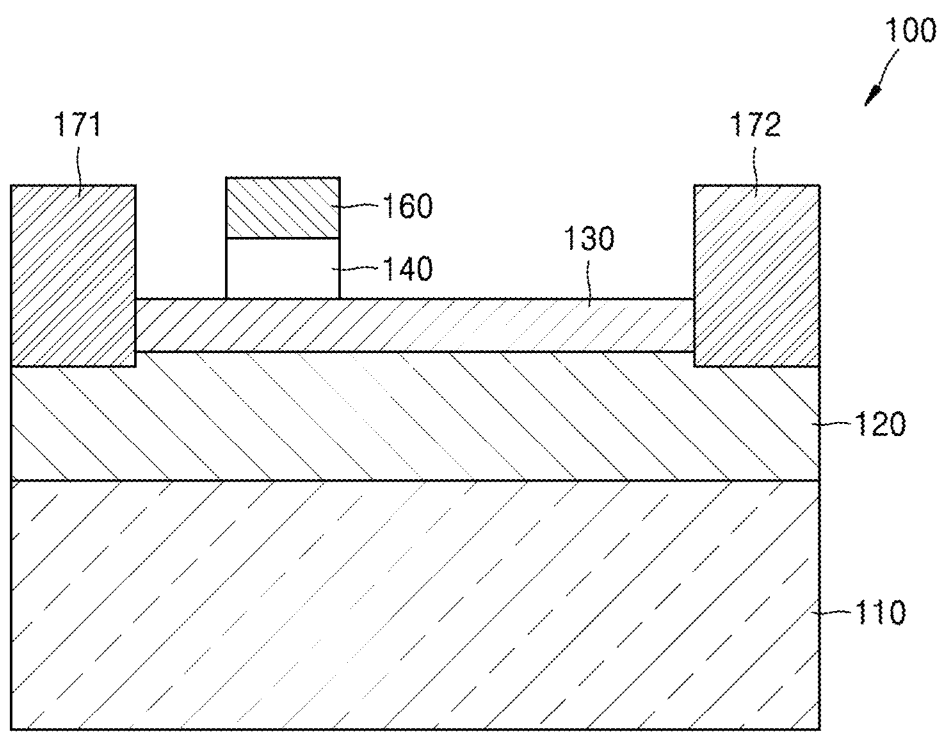
FIGS. 5 to 7 are views for explaining a method of manufacturing the high electron mobility transistor shown in FIG. 1.
Figure 6:
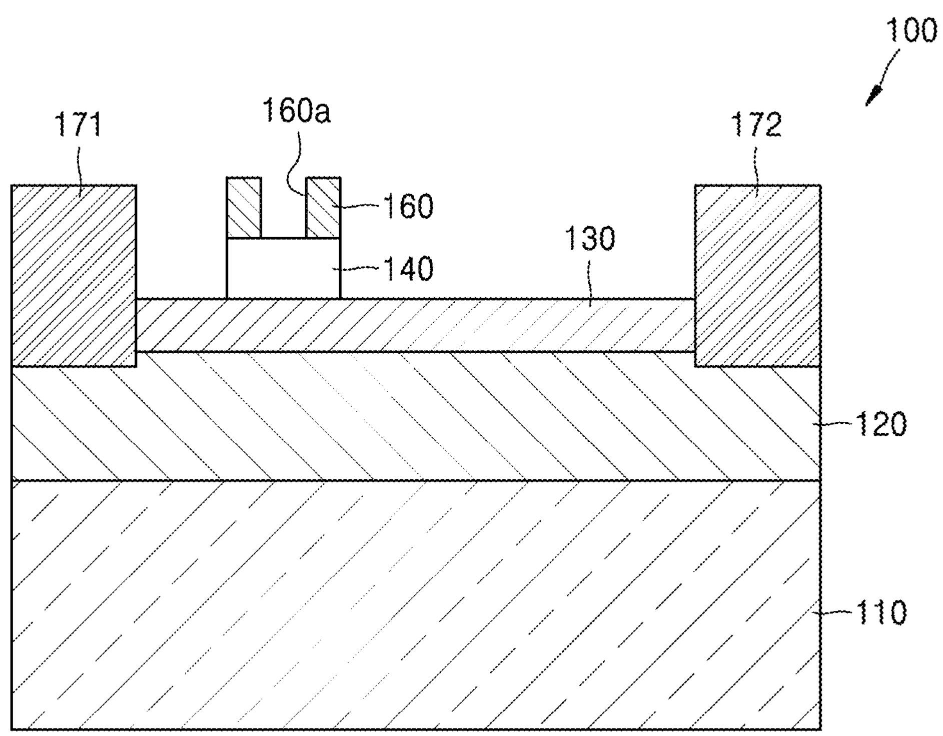
Figure 7:
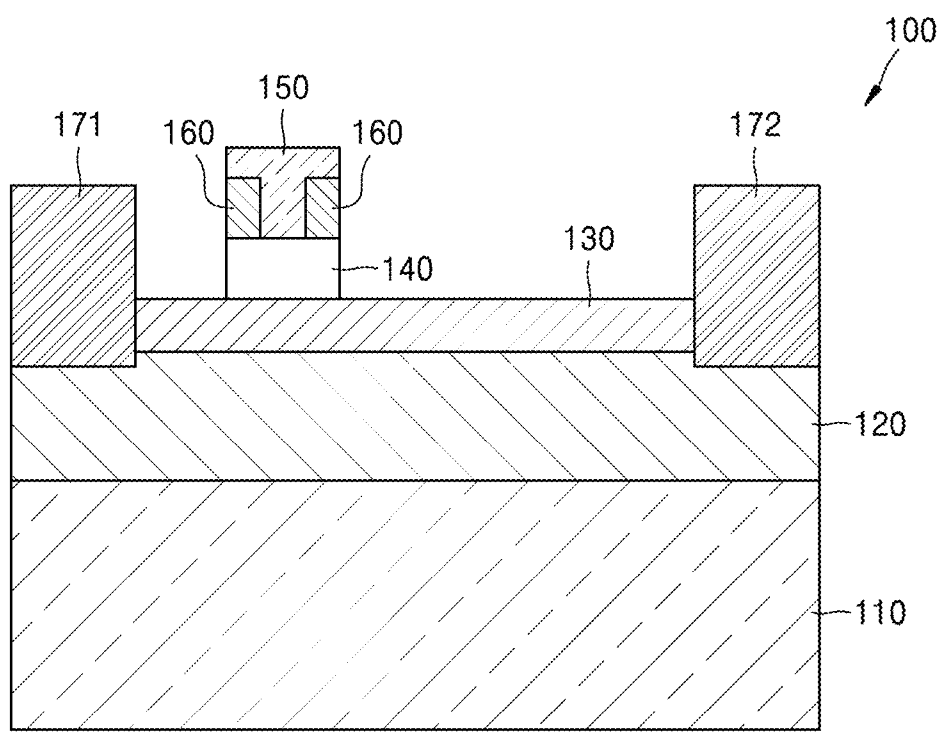

FIGS. 5 to 7 are views for explaining a manufacturing method of the HEMT shown in FIG. 1. Each layer in FIGS. 5 to 7 may be formed by, for example, metal-organic chemical vapor deposition (MOCVD), but is not limited thereto.

Referring to FIG. 5, the channel layer 120 and the channel supply layer 130 are sequentially deposited on the substrate 110. The channel layer 120 may include a first semiconductor material. Here, the first semiconductor material may be a III-V-based compound semiconductor material, but is not limited thereto.

The channel supplying layer 130 may include a second semiconductor material different from the first semiconductor material forming the channel layer 120. The second semiconductor material may have at least one of a polarization characteristic, an energy bandgap, and a lattice constant, which is different from that of the first semiconductor material. The channel supplying layer 130 may include at least one selected from nitrides including at least one of Al, Ga, In, and B, for example.

The source electrode 171 and the drain electrode 172 are formed on the channel layers 120 on both sides of the channel supply layer 130. The source electrode 171 and the drain electrode 172 may be formed in various forms, and their formation order may be variously modified.

After the depletion forming layer 140 and the current limiting layer 160 are sequentially deposited on the channel supply layer 130, the current limiting layer 160 and the depletion forming layer 140 are etched in a desired (and/or alternatively predetermined) form. The depletion forming layer 140 may include a p-type semiconductor material. The current limiting layer 160 may include an n-type semiconductor material. Furthermore, although not shown in the drawing, after depositing the current limiting layer 160, an etch stop layer 380 (see FIG. 9) described later may be further deposited thereon.

Referring to FIG. 6, the central portion of the current limiting layer 160 is etched to form a trench 160*a* that exposes the depletion forming layer 140. Subsequently, referring to FIG. 7, the gate electrode 150 is deposited to fill the trench 160*a* in the current limiting layer 160. FIG. 7 illustrates a case in which a pair of current limiting layers separated by a gate electrode is formed. Moreover, as described later, the current limiting layer 160 may be formed to surround the lower portion of the gate electrode 150.

Figure 8:
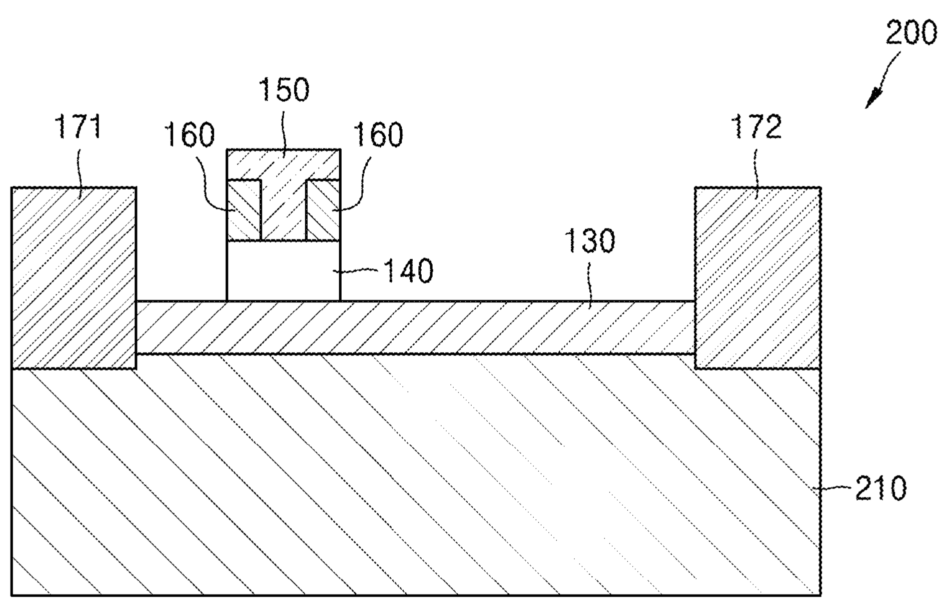
FIG. 8 shows a high electron mobility transistor according to another example embodiment.

FIG. 8 shows an HEMT 200 according to another example embodiment. The HEMT 200 illustrated in FIG. 8 is the same as the HEMT 100 illustrated in FIG. 2 except that the substrate 210 is used as a channel layer.

Referring to FIG. 8, a channel supplying layer 130 is provided on the substrate 210. The substrate 210 may include a first semiconductor material as a channel material. Here, the first semiconductor material may be a III-V-based compound semiconductor material, but is not limited thereto. For example, the substrate 210 may include a GaN-based material.

The channel supplying layer 130 may induce a 2DEG to the substrate 210. The channel supplying layer 130 may include a second semiconductor material different from the first semiconductor material forming the substrate 210. The source electrode 171 and the drain electrode 172 may be provided on the substrate 210 on both sides of the channel supplying layer 130.

A depletion forming layer 140 may be provided on the channel supplying layer 130. Then, a gate electrode 150 and a pair of current limiting layers 160 split by the gate electrode 150 may be provided on the depletion forming layer 140. The depletion forming layer 140, the gate electrode 150, and the current limiting layer 160 have been described above, so a description thereof will be omitted.

Figure 9:
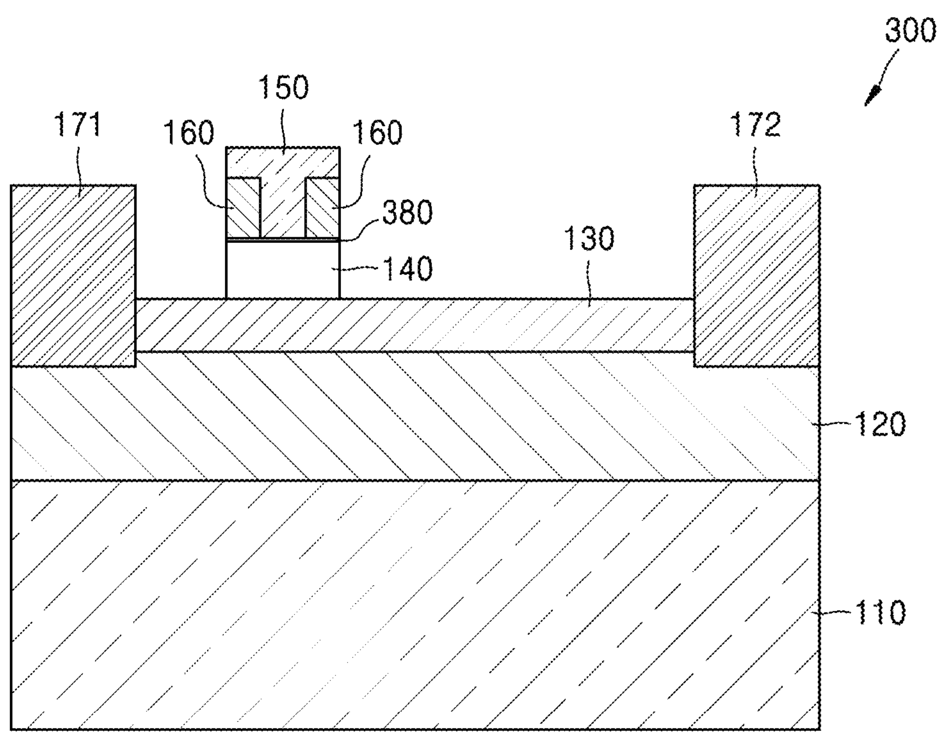
FIG. 9 shows a high electron mobility transistor according to another example embodiment.

FIG. 9 shows an HEMT 300 according to another example embodiment. The HEMT 300 shown in FIG. 9 is the same as the HEMT 100 shown in FIG. 2 except that it includes an etch stop layer 380.

Referring to FIG. 9, an etch stop layer 380 may be provided between the depletion forming layer 140 and the gate electrode 150 and the current limiting layer 160 provided thereon. The etch stop layer 380 may serve to stop the etching process of the current limiting layer 160 that exposes the above-described depletion forming layer 140 on the upper surface of the depletion forming layer 140. The etch stop layer 380 may include, for example, a compound including Al, but is not limited thereto. As a specific example, the etch stop layer 380 may include AlxGaN ($0<x\leq 1$), AlN, or AlInN.

Furthermore, FIG. 9 illustrates a case where the etch stop layer 380 exists between the gate electrode 150 and the depletion forming layer 140, but the etch stop layer 380 may be removed between the gate electrode 150 and the depletion forming layer 140 through an etching process of the current limiting layer 160.

Figure 10:
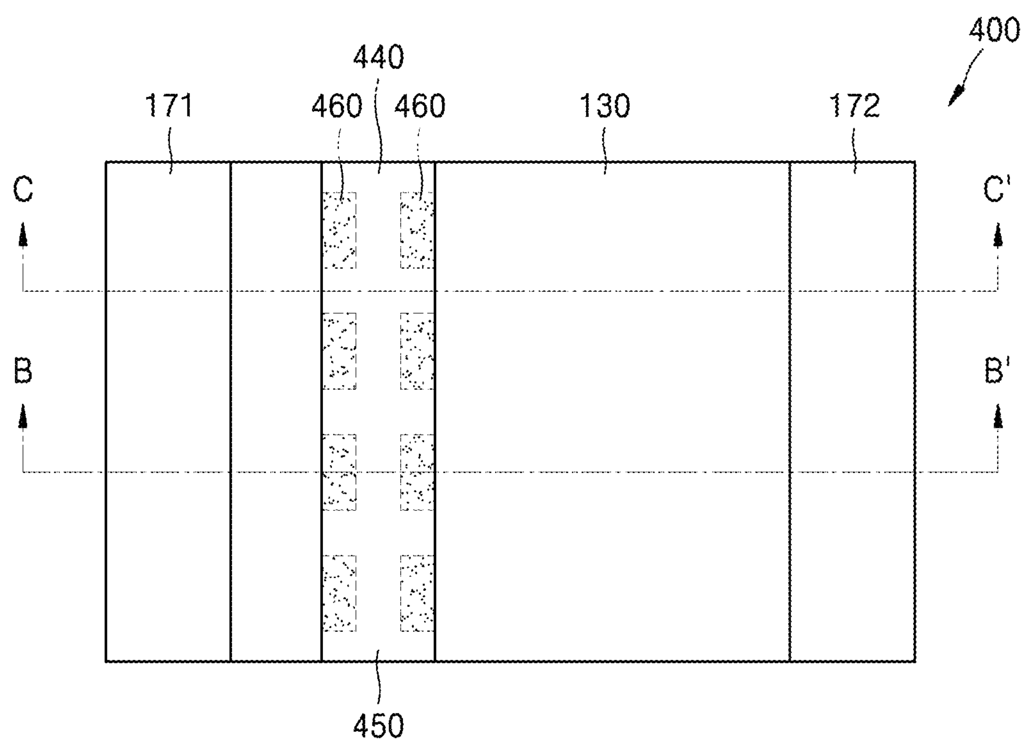
FIG. 10 is a plan view showing a high electron mobility transistor according to another example embodiment.
Figure 11:
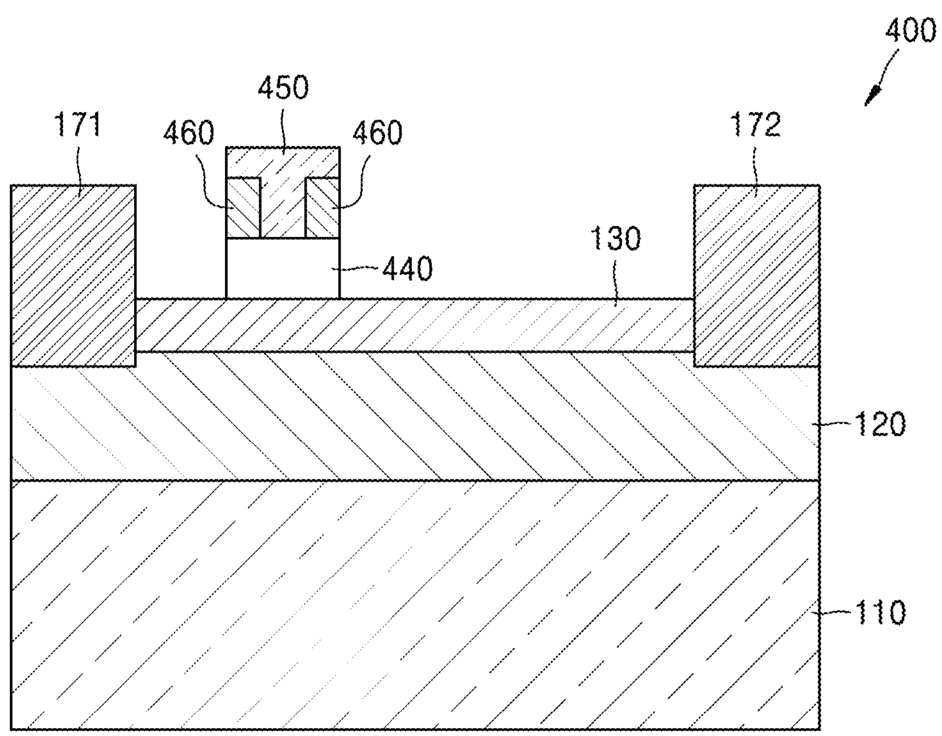
FIG. 11 is a cross-sectional view taken along line B-B' of FIG. 10.
Figure 12:
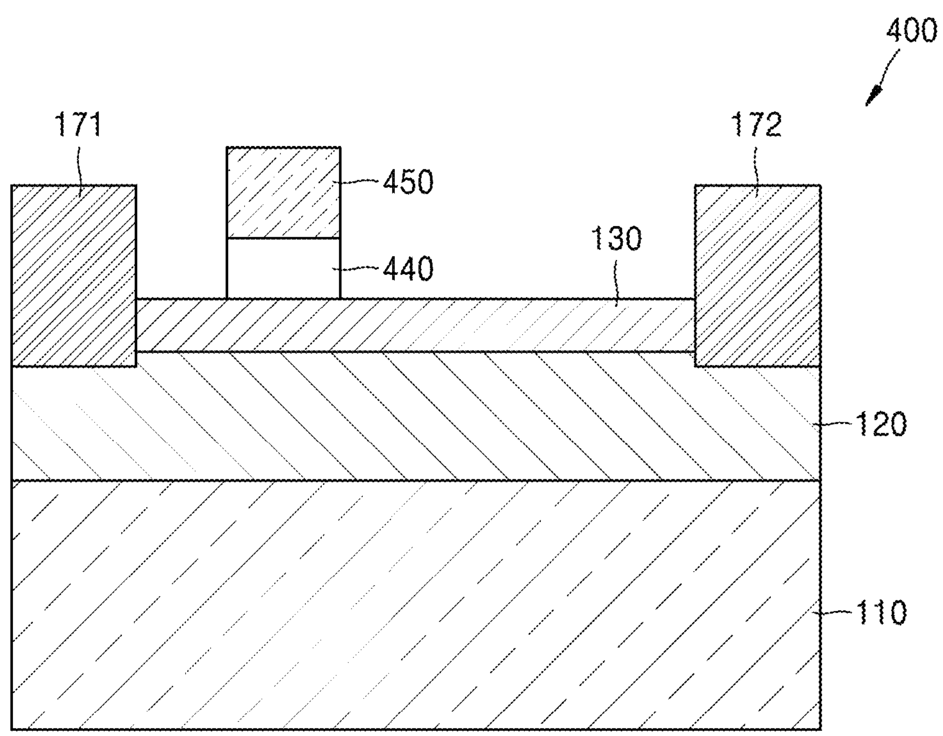
FIG. 12 is a cross-sectional view taken along line C-C' of FIG. 10.

FIG. 10 is a plan view showing an HEMT 400 according to another example embodiment. FIG. 11 is a cross-sectional view taken along line B-B' of FIG. 10, and FIG. 12 is a cross-sectional view taken along line C-C' of FIG. 10. Hereinafter, the differences from the above-described embodiments will be mainly described.

Referring to FIGS. 10 to 12, a depletion forming layer 440 may be provided on a channel supplying layer 130. The depletion forming layer 440 may include a p-type semiconductor material. Here, the depletion forming layer 440 may be provided as an integral type extending in a direction parallel to the source electrode 171 and the drain electrode 172.

A gate electrode 450 and a pair of current limiting layers 460 split by the gate electrode 450 may be provided on the depletion forming layer 440. The current limiting layer 460 may include an n-type semiconductor material. The gate electrode 450 may be formed as an integral type extending in a direction parallel to the depletion forming layer 440.

Each current limiting layer 460 may be provided to be spaced apart a desired (and/or alternatively predetermined) distance in a direction parallel to the gate electrode 450 on the depletion forming layer 440. In this case, the gate electrode 450 may be provided between the current limiting layers 460 spaced apart in a direction parallel to the gate electrode 450 on the depletion forming layer 440.

The gate electrode 450 may include an upper portion contacting an upper surface of the current limiting layer 460 and a lower portion contacting a side surface of the current limiting layer 460. The interval between the pair of current limiting layers 460 separated by the gate electrode 450 may be determined by the maximum value of the gate current. In addition, the area and height of each current limiting layer 460 may be adjusted by the concentration of n-type impurities in the current limiting layer 460 or may be adjusted according to the concentration of p-type impurities in the depletion forming layer 440.

Figure 13:
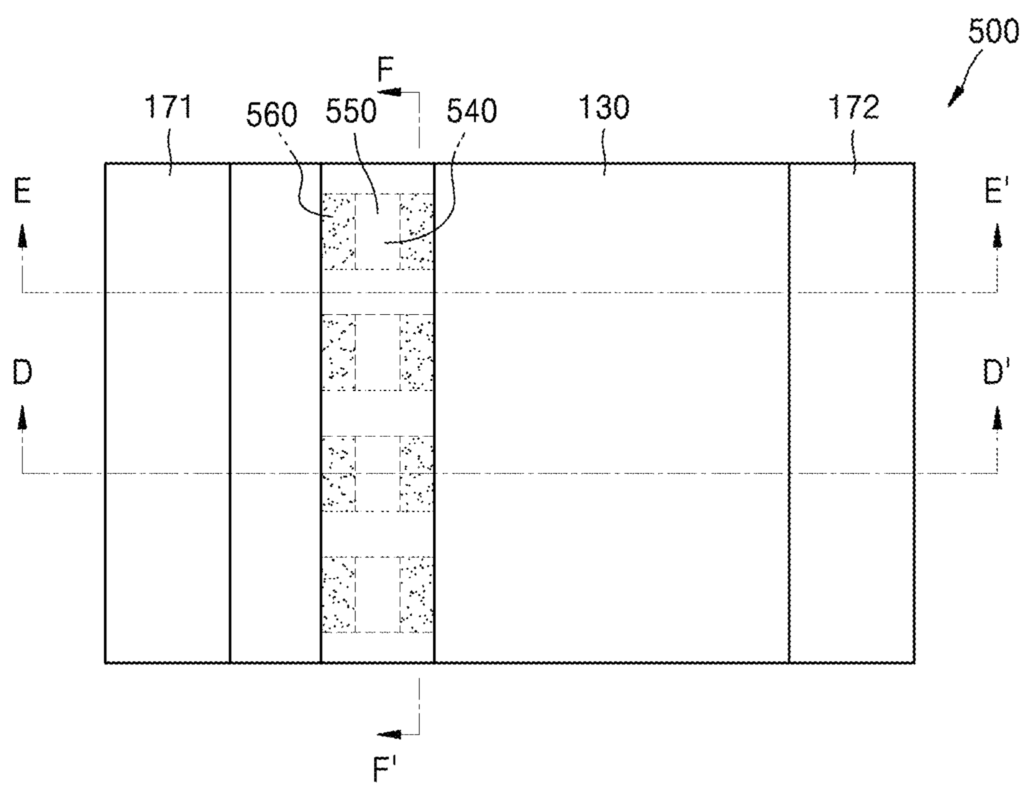
FIG. 13 is a plan view showing a high electron mobility transistor according to another example embodiment.
Figure 14:
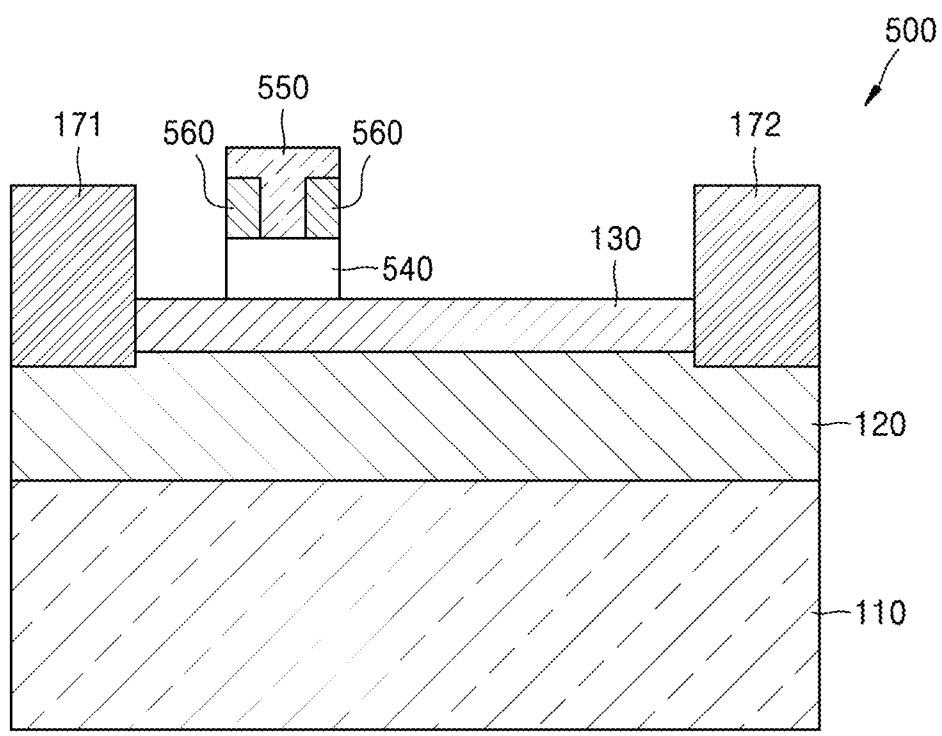
FIG. 14 is a cross-sectional view taken along line D-D' of FIG. 13.
Figure 15:
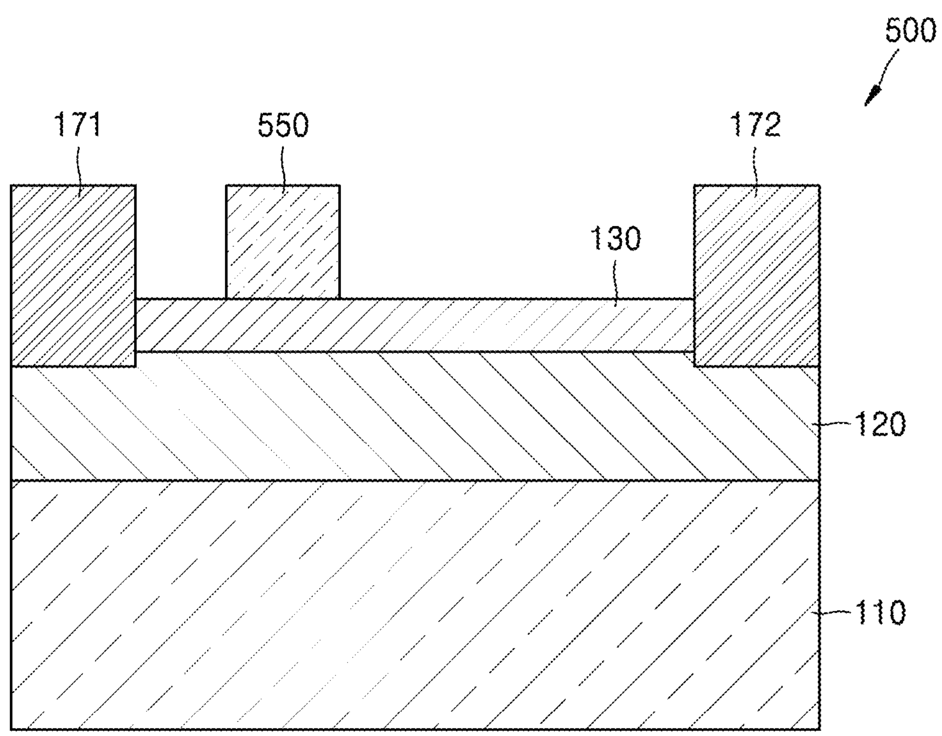
FIG. 15 is a cross-sectional view taken along line E-E' of FIG. 13.
Figure 16:
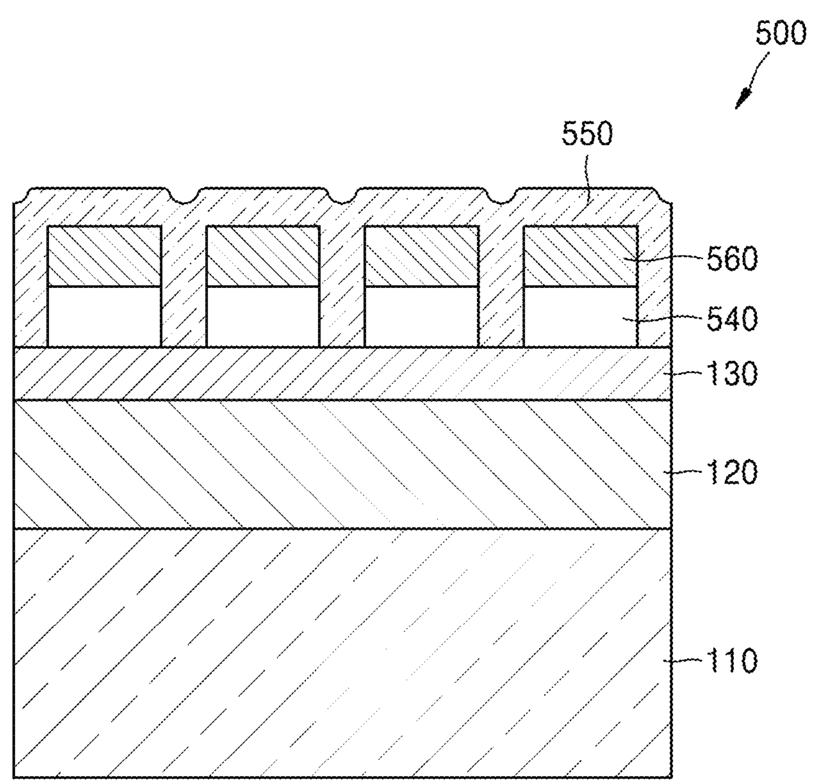
FIG. 16 is a cross-sectional view taken along line F-F' of FIG. 13.

FIG. 13 is a plan view showing an HEMT 500 according to another example embodiment. FIG. 14 is a cross-sectional view taken along line D-D' of FIG. 13, FIG. 15 is a cross-sectional view taken along line E-E' of FIG. 13, and FIG. 16 is a cross-sectional view taken along line F-F' of FIG. 13.

Referring to FIGS. 13 to 16, a depletion forming layer 540 including a p-type semiconductor material may be provided on a channel supplying layer 130. The depletion forming layer 540 may be provided to be spaced apart a desired (and/or alternatively predetermined) distance in a direction parallel to the source electrode 171 and the drain electrode 172. Here, the depletion forming layers 540 adjacent to each other may be spaced apart at intervals such that a depletion region of a 2DEG can be formed. For example, an interval between the depletion forming layers 540 spaced apart from each other may be approximately 1 μm or less. However, inventive concepts are not limited thereto. As a specific example, the interval between the depletion forming layers 540 spaced apart from each other may be approximately 200 nm or less.

A gate electrode 550 and a pair of current limiting layers 560 split by the gate electrode 550 may be provided on each depletion forming layer 540. The current limiting layer 560 may include an n-type semiconductor material. The gate electrode 550 may be provided as an integral type extending in a direction parallel to the source electrode and the drain electrode.

Each current limiting layer 560 may be provided only on the depletion forming layer 540 to be spaced apart a desired (and/or alternatively predetermined) distance in a direction parallel to the gate electrode 550. In this case, the gate electrode 550 may be provided between the depletion forming layers 540 spaced apart in the direction parallel to the gate electrode 550 on the channel supply layer 130.

Figure 17:
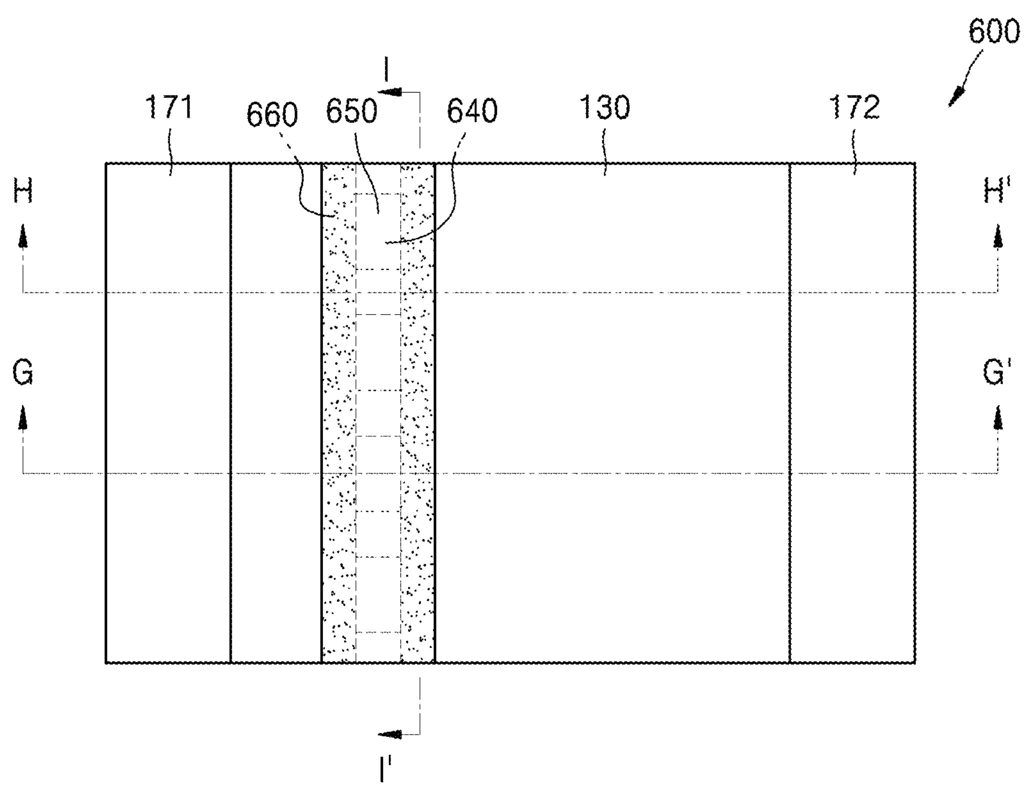
FIG. 17 is a plan view showing a high electron mobility transistor according to another example embodiment.
Figure 18:
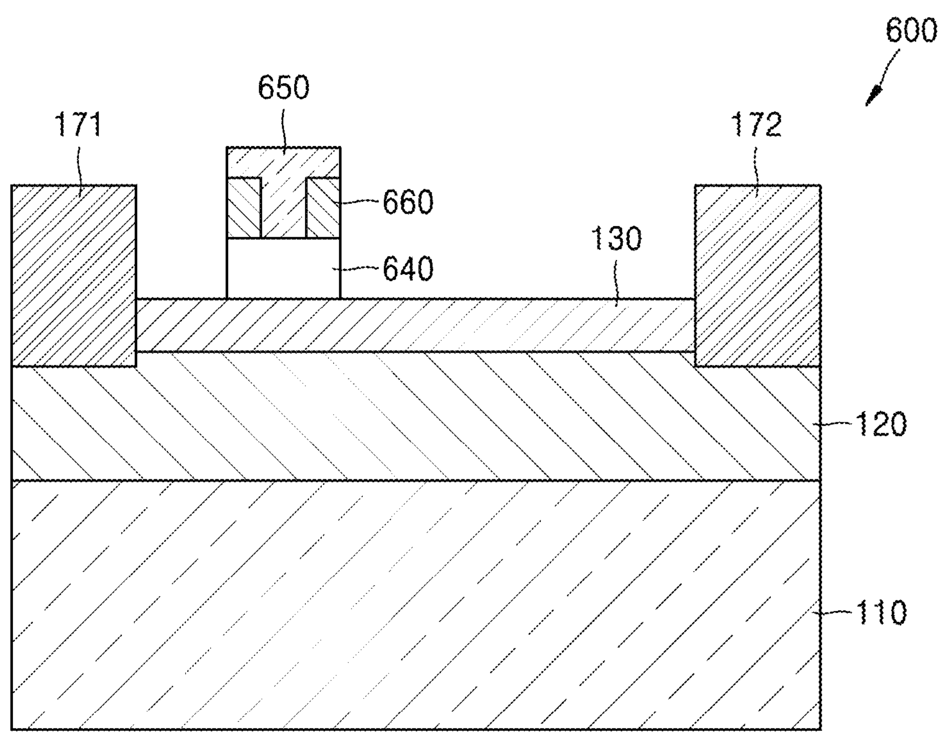
FIG. 18 is a cross-sectional view taken along line G-G' of FIG. 17
Figure 19:
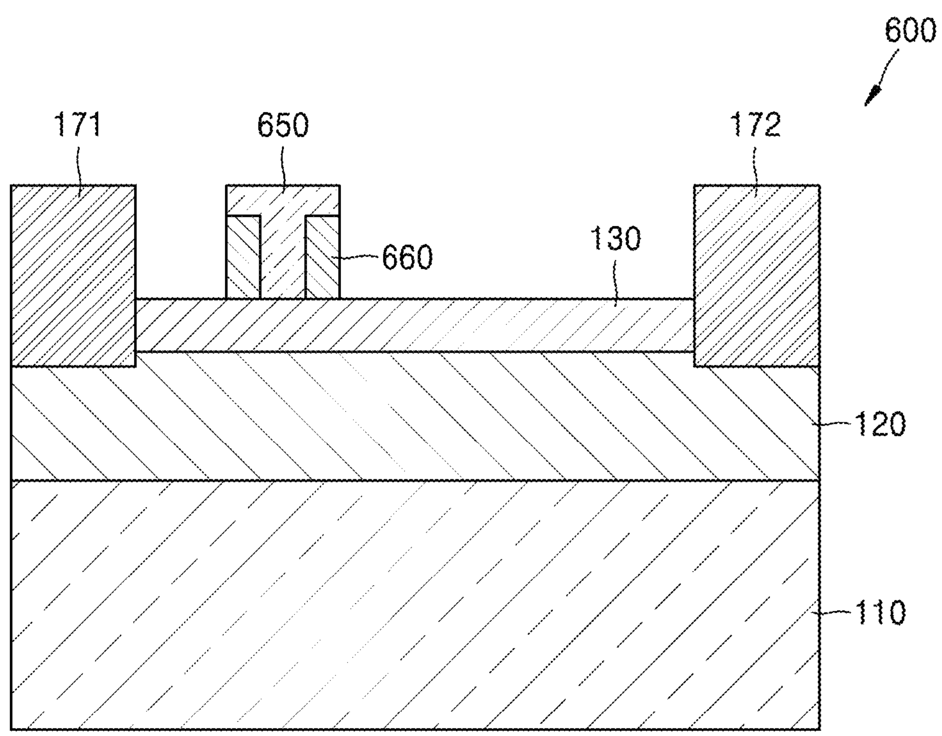
FIG. 19 is a cross-sectional view taken along line H-H' of FIG. 17.
Figure 20:
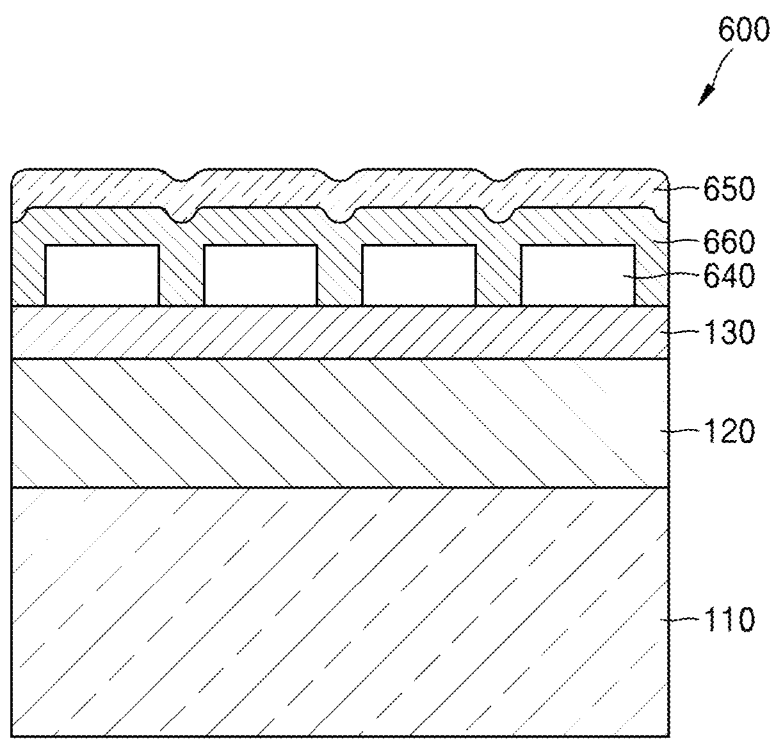
FIG. 20 is a cross-sectional view taken along line I-I' of FIG. 17.

FIG. 17 is a plan view showing an HEMT 600 according to another example embodiment. FIG. 18 is a cross-sectional view taken along line G-G' of FIG. 17, FIG. 19 is a cross-sectional view taken along line H-H' of FIG. 17, and FIG. 20 is a cross-sectional view taken along line I-I' of FIG. 17.

Referring to FIGS. 17 to 20, a depletion forming layer 640 including a p-type semiconductor material may be provided on a channel supplying layer 130. The depletion forming layer 640 may be provided to be spaced apart a desired (and/or alternatively predetermined) distance in a direction parallel to the source electrode 171 and the drain electrode 172.

A gate electrode 650 and a pair of current limiting layers 660 split by the gate electrode 650 may be provided on the depletion forming layer 640. The current limiting layer 660 may include an n-type semiconductor material. The gate electrode 650 may be provided as an integral type extending in a direction parallel to the source electrode 171 and the drain electrode 172.

Figure 24:
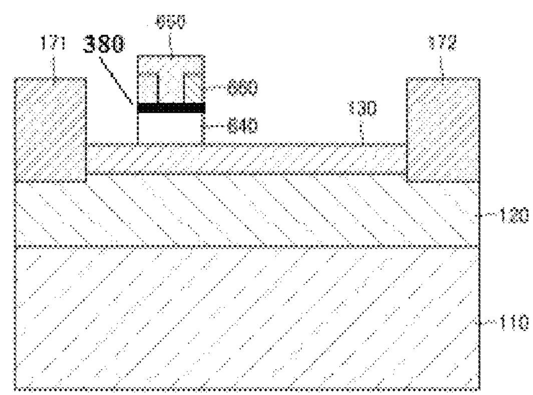
FIG. 24 is a modification of FIG. 18.

Each current limiting layer 660 may be provided on the channel supplying layer 130 to cover the depletion forming layer 640 spaced apart in a direction parallel to the gate electrode 650. In this case, the current limiting layer 660 and the gate electrode 650 may be provided between the depletion forming layers 640 spaced apart in a direction parallel to the gate electrode 650 on the channel supplying layer 130. Furthermore, although not shown in FIGS. 17-19, an etch stop layer 380 (see FIG. 9) may be provided between the current limiting layer 660 and the depletion forming layer 640, as depicted in FIG. 24.

Figure 21:
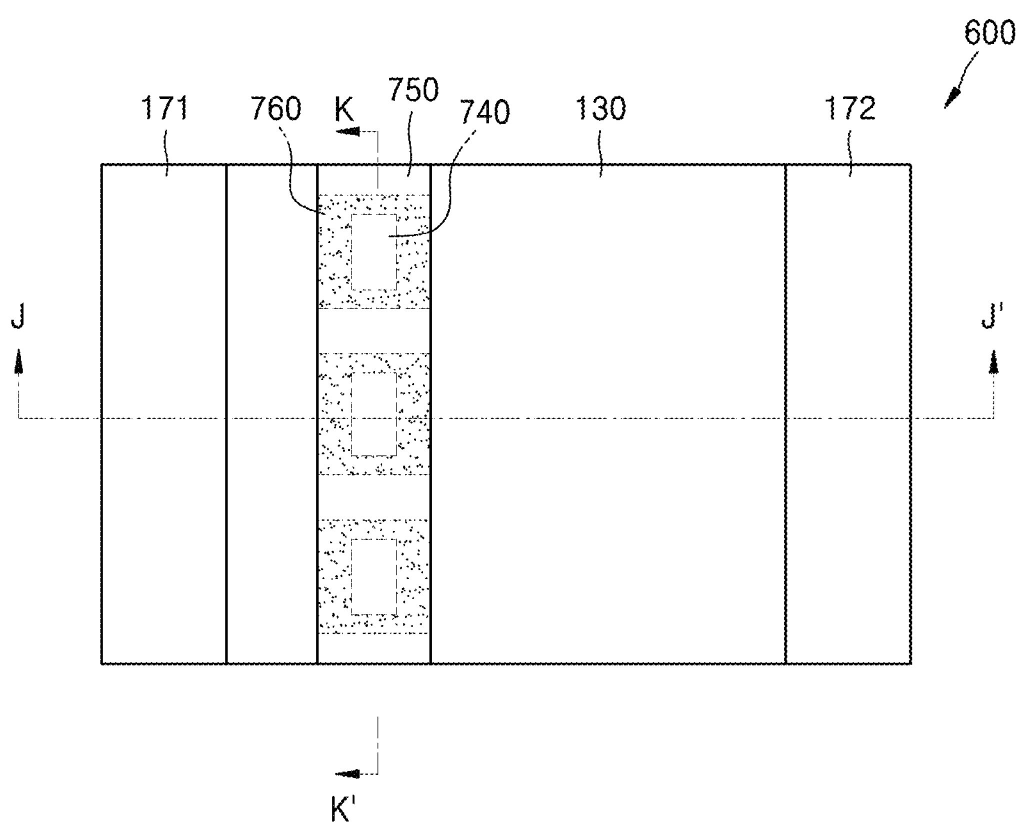
FIG. 21 is a plan view showing a high electron mobility transistor according to another example embodiment.
Figure 22:
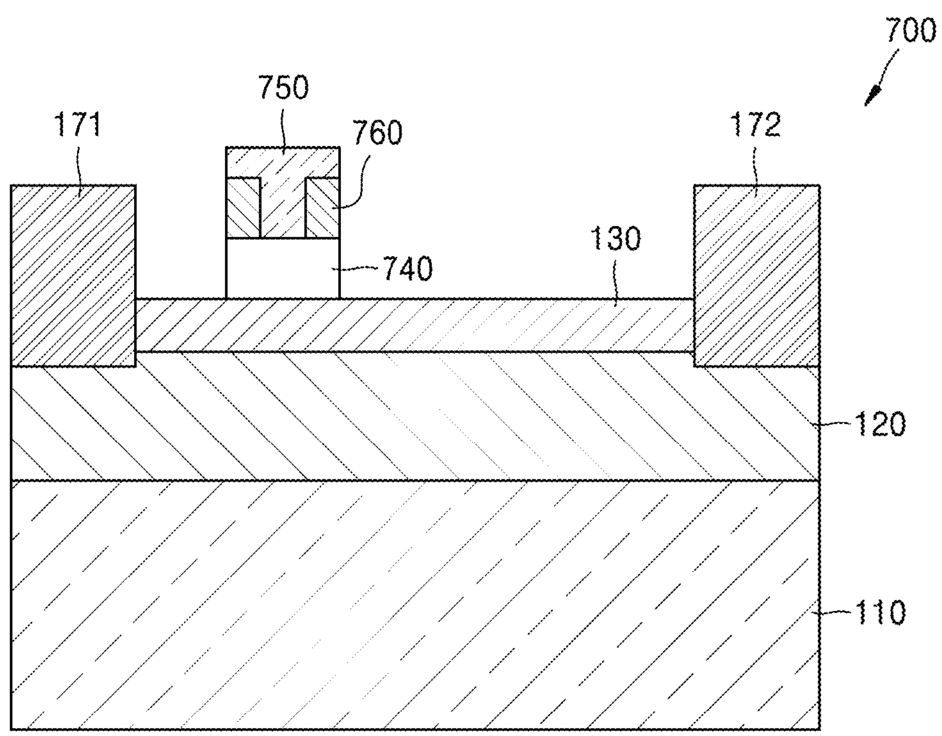
FIG. 22 is a cross-sectional view taken along line J-J' of FIG. 21.

FIG. 21 is a plan view showing an HEMT 700 according to another example embodiment. FIG. 22 is a cross-sectional view taken along line J-J' in FIG. 21, and FIG. 23 is a cross-sectional view taken along line K-K' in FIG. 22.

Figure 23:
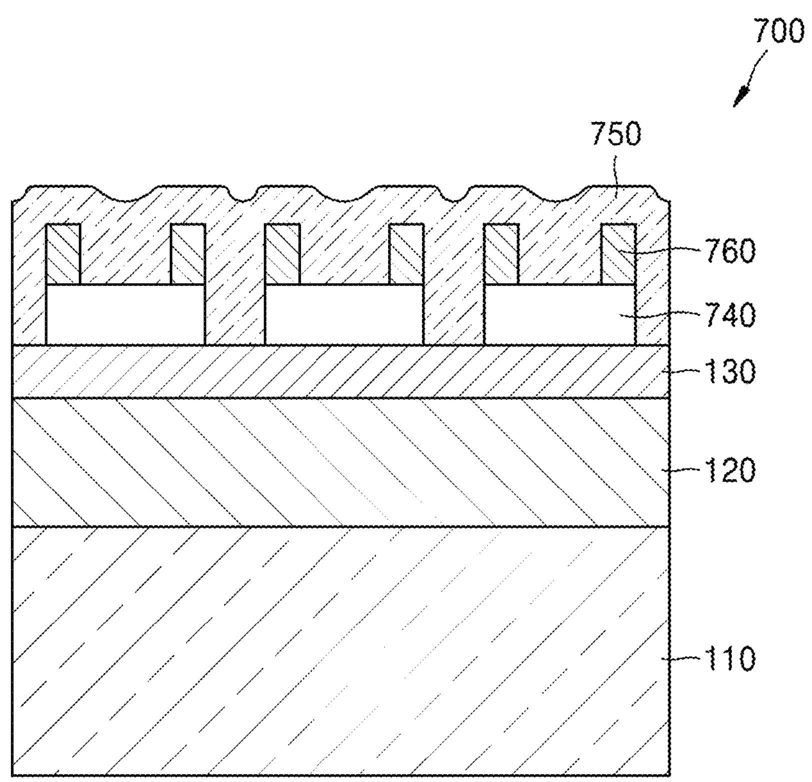
FIG. 23 is a cross-sectional view taken along line K-K' of FIG. 22.

Referring to FIGS. 21 to 23, a depletion forming layer 740 including a p-type semiconductor material may be provided on a channel supplying layer 130. The depletion forming layer 740 may be provided to be spaced apart a desired (and/or alternatively predetermined) distance in a direction parallel to the source electrode 171 and the drain electrode 172.

A gate electrode 750 and a current limiting layer 760 surrounding the lower portion of the gate electrode 750 may be provided on each depletion forming layer 740. The current limiting layer 760 may include an n-type semiconductor material. The gate electrode 750 may be formed as an integral type extending in a direction parallel to the source electrode 171 and the drain electrode 172.

Each current limiting layer 760 may be provided only on the depletion forming layer 740 to be spaced apart a desired (and/or alternatively predetermined) distance in a direction parallel to the gate electrode 750. In this case, the gate electrode 750 may be provided between the depletion forming layers 740 spaced apart in the direction parallel to the gate electrode 750 on the channel supply layer 130.

In the above, the case where the depletion forming layer 740 is provided to be spaced apart a desired (and/or alternatively predetermined) distance in the direction parallel to the gate electrode 750 has been described but the depletion forming layer 740 may also be provided as an integral type extending in the direction parallel to the gate electrode 750.

In this case, the current limiting layer 760 surrounding the lower portion of the gate electrode 750 may be provided to be spaced a desired (and/or alternatively predetermined) distance apart or as an integral type extending on the depletion forming layer. In addition, when the current limiting layer 760 is provided on the depletion forming layer 740 spaced apart in the direction parallel to the gate electrode 750, the gate electrode 750 may be provided between the current limiting layers 760.

In the HEMT according to the above example embodiment, as the p-type semiconductor layer depletion forming layer and the n-type semiconductor layer current limiting layer are provided in contact with the gate electrode, when a high voltage is applied to the gate electrode, it is possible to prevent the leakage current through the gate electrode from increasing by expanding the depletion region by the p-n junction. Although the embodiments have been described above, these are merely just examples, and those having ordinary skill in the art can make various modifications therefrom.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A high electron mobility transistor comprising:

a channel layer including a first semiconductor material;

a channel supplying layer including a second semiconductor material and causing generation of a two-dimensional electron gas (2DEG) in the channel layer;

a source electrode and a drain electrode provided on both sides of the channel supplying layer and spaced apart from each other in a first direction;

a depletion forming layer provided on the channel supplying layer to form a depletion region in the 2DEG;

a gate electrode provided on a portion of the depletion forming layer; and a current limiting layer provided to contact the gate electrode on another portion of the depletion forming layer, and configured to limit a current flow from the gate electrode to the depletion forming layer according to a voltage applied to the gate electrode, wherein the gate electrode comprises an upper portion in contact with an upper surface of the current limiting layer and a lower portion in contact with a side surface of the current limiting layer, wherein the depletion forming layer includes portions spaced apart from each other in a direction parallel to a length of the gate electrode, the direction parallel to the length of the gate electrode being a second direction crossing the first direction, wherein the current limiting layer is of an integral type and extends in the direction parallel to the length of the gate electrode, the portions of the depletion forming layer are physically separated from each other, the portions of the depletion forming layer include a first portion spaced from a second portion, and a sidewall of the first portion is spaced apart from and faces a sidewall of the second portion.

2. The high electron mobility transistor of claim 1, wherein the depletion forming layer comprises a p-type III-V group nitride semiconductor, and the current limiting layer comprises an n-type III-V group nitride semiconductor.

3. The high electron mobility transistor of claim 1, wherein the current limiting layer is respectively provided on both a first lower side of the gate electrode and a second lower side of the gate electrode.

4. The high electron mobility transistor of claim 1, wherein the current limiting layer surrounds the depletion forming layer.

5. The high electron mobility transistor of claim 1, further comprising:

an etch stop layer between the current limiting layer and the depletion forming layer.

6. The high electron mobility transistor of claim 1, wherein the first semiconductor material comprises a GaN-based material.

7. The high electron mobility transistor of claim 1, wherein the second semiconductor material comprises a nitride including at least one of Al, Ga, In, and B.

8. The high electron mobility transistor of claim 1, wherein the channel supplying layer includes first regions and second regions alternating in the second direction, the portions of the depletion forming layer, including the first portion and the second portion, are on the first regions of the channel supplying layer, and the portions of the depletion forming layer are not on the second regions of the channel supplying layer.

9. The high electron mobility transistor of claim 1, wherein the channel supplying layer includes first regions and second regions alternating in the second direction, the lower portion of the gate electrode has a first thickness over the first regions of the channel supplying layer and a second thickness over the second regions of the channel supplying layer, the first thickness is less than the second thickness, the first thickness is from a lowermost surface of the gate electrode over the first regions to a same level as an upper surface of the current limiting layer over the first regions, and the second thickness is from a lowermost surface of the gate electrode over the second regions to a same level as the upper surface of the current limiting layer over the second regions.

10. The high electron mobility transistor of claim 1, wherein the channel supplying layer includes first regions and second regions alternating in the second direction, the current limiting layer has a first thickness over the first regions of the channel supplying layer and a second thickness over the second regions of the channel supplying layer, and the first thickness is less than the second thickness.

11. The high electron mobility transistor of claim 1, wherein the channel supplying layer includes first regions and second regions alternating in the second direction, a maximum thickness of the gate electrode over the first regions of the channel supplying layer is less than a maximum thickness of the gate electrode over the second regions of the channel supplying layer, and a thickness of the current limiting layer over the first regions of the channel supplying layer is less than a thickness of the current limiting layer over the second regions of the channel supplying layer.

12. The high electron mobility transistor of claim 1, wherein the channel supplying layer includes first regions and second regions alternating in the second direction, the gate electrode is spaced apart from the first regions of the channel supplying layer, and the gate electrode is in contact with the second regions of the channel supplying layer.

13. The high electron mobility transistor of claim 1, wherein the channel supplying layer includes first regions and second regions alternating in the second direction, the current limiting layer is spaced apart from the first regions of the channel supplying layer, and the current limiting layer is in contact with the second regions of the channel supplying layer.

14. The high electron mobility transistor of claim 13, wherein the gate electrode is spaced apart from the first regions of the channel supplying layer, and the gate electrode is in contact with the second regions of the channel supplying layer.

15. The high electron mobility transistor of claim 1, wherein the channel supplying layer includes first regions and second regions alternating in the second direction, and an upper surface of the gate electrode over the first regions of the channel supplying layer is higher than an upper surface of the gate electrode over the second regions of the channel supplying layer.

16. The high electron mobility transistor of claim 1, wherein the channel supplying layer includes first regions and second regions alternating in the second direction, and an upper surface of the current limiting layer over the first regions of the channel supplying layer is higher than an upper surface of the current limiting layer over the second regions of the channel supplying layer.

17. The high electron mobility transistor of claim 1, wherein the channel supplying layer includes first regions and second regions alternating in the second direction, and an upper surface of the gate electrode over the first regions of the channel supplying layer is higher than an upper surface of the gate electrode over the second regions of the channel supplying layer.

18. The high electron mobility transistor of claim 1, wherein the channel supplying layer includes first regions and second regions alternating in the second direction, an uppermost surface of the gate electrode over the first regions of the channel supplying layer is level with an upper surface of the source electrode, and an uppermost surface of the gate electrode over the second regions of the channel supplying layer is not level with the upper surface of the source electrode.

19. The high electron mobility transistor of claim 1, wherein a lowermost surface of the gate electrode is a same level as a lowermost surface of the depletion forming layer.

20. The high electron mobility transistor of claim 1, wherein a lowermost surface of the current limiting layer is a same level as a lowermost surface of the depletion forming layer.

* * * * *